(12) United States Patent
Shumarayev et al.

(10) Patent No.: US 8,397,096 B2
(45) Date of Patent: Mar. 12, 2013

(54) HETEROGENEOUS PHYSICAL MEDIA ATTACHMENT CIRCUITRY FOR INTEGRATED CIRCUIT DEVICES

(75) Inventors: Sergey Shumarayev, Los Altos Hills, CA (US); Edwin Yew Fatt Kok, Penang (MY); Lip Kai Soh, Perak (MY); Chee Hong Aw, Selangor (MY); Tee Wee Tan, Penang (MY)

(73) Assignee: Altera Corporation, San Jose, CA (US)

( * ) Notice: Subject to any disclaimer, the term of this patent is extended or adjusted under 35 U.S.C. 154(b) by 356 days.

(21) Appl. No.: 12/785,047

(22) Filed: May 21, 2010

(65) Prior Publication Data

US 2011/0285434 A1   Nov. 24, 2011

(51) Int. Cl.
  G06F 1/00 (2006.01)
  G06F 1/04 (2006.01)
  G06F 13/14 (2006.01)
(52) U.S. Cl. .................... 713/500; 713/600; 710/305
(58) Field of Classification Search .................. 710/300, 710/305, 316–317; 713/400, 500, 503, 600; 370/464–465, 468, 503, 516, 518
See application file for complete search history.

(56) References Cited

U.S. PATENT DOCUMENTS

| | | | |
|---|---|---|---|
| 7,158,587 B2 | 1/2007 | Yang et al. | |
| 7,304,507 B1* | 12/2007 | Tran et al. | 326/93 |
| 7,493,095 B2 | 2/2009 | Chuang et al. | |
| 7,616,657 B2* | 11/2009 | Shumarayev et al. | 370/464 |
| 7,812,659 B1* | 10/2010 | Shumarayev et al. | 327/291 |
| 2005/0180536 A1* | 8/2005 | Payne et al. | 375/354 |
| 2005/0286669 A1 | 12/2005 | Buchwald et al. | |
| 2006/0071691 A1* | 4/2006 | Garlepp | 326/93 |
| 2007/0018863 A1* | 1/2007 | Hoang et al. | 341/100 |
| 2007/0019766 A1* | 1/2007 | Bereza et al. | 375/354 |
| 2007/0030184 A1* | 2/2007 | Nguyen et al. | 341/100 |
| 2007/0127616 A1* | 6/2007 | Shumarayev et al. | 375/376 |
| 2007/0237186 A1* | 10/2007 | Shumarayev et al. | 370/535 |
| 2008/0300992 A1* | 12/2008 | Wang et al. | 705/16 |
| 2009/0052600 A1 | 2/2009 | Chen et al. | |
| 2009/0146852 A1 | 6/2009 | Diab | |
| 2010/0097251 A1* | 4/2010 | Liu et al. | 341/111 |

OTHER PUBLICATIONS

Cyclone IV Device Handbook, vol. 2, Altera Corporation, Jul. 2010, http://www.altera.com/literature/hb/cyclone-iv/cyiv-52001.pdf, especially pp. 1-1 through 1-3.

Spartan-6 FPGA GTP Transceivers, Advance Product Specification, Xilinx Corporation, UG386 (v2.2) Apr. 30, 2010, http://www.xilinx.com/support/documentation/user_guides/ug386.pdf, especially p. 16.

Lattice ECP3 SERDES/PCS Usage Guide, Technical Note TN1176, Lattice Semiconductor Corporation, Jun. 2010, http://www.laticesemi.com/documents/tn1176.pdf, especially pp. 8-8 through 8-11.

* cited by examiner

*Primary Examiner* — Thomas J Cleary
(74) *Attorney, Agent, or Firm* — Ropes & Gray LLP; Jeffrey H. Ingerman

(57) ABSTRACT

An integrated circuit includes physical media attachment ("PMA") circuitry that includes two different kinds of transceiver channels for serial data signals. One kind of transceiver channel is adapted for transceiving relatively low-speed serial data signals. The other kind of transceiver channel is adapted for transceiving relatively high-speed serial data signals. A high-speed channel is alternatively usable as phase-locked loop ("PLL") circuitry for providing a clock signal for use by other high- and/or low-speed channels. A low-speed channel can alternatively get a clock signal from separate low-speed PLL circuitry.

21 Claims, 11 Drawing Sheets

HETEROGENEOUS PHYSICAL MEDIA ATTACHMENT CIRCUITRY FOR INTEGRATED CIRCUIT DEVICES

BACKGROUND

This disclosure relates to integrated circuits ("ICs"). The invention may be of particular interest in connection with ICs that are designed for relatively general-purpose use, rather than for only one particular use that has been fully specified in advance of design and fabrication of the IC. Examples of such relatively general-purpose ICs are field-programmable gate arrays ("FPGAs"), programmable logic devices ("PLDs"), programmable microcontrollers, and the like. Such general-purpose devices are designed, fabricated (manufactured), and sold so that they can support the typically differing needs of various users. Each user is able to customize the IC (e.g., by programming the IC) to perform the particular functions needed by that user.

Manufacturers of such relatively general-purpose ICs typically want to be able to provide a range of such products that are targeted to different segments of the market. For example, one segment of such a market may comprise users who need ICs that can support very high speed communication of data between multiple devices (e.g., between multiple ICs) in a system. General-purpose ICs that can support such high-speed communication tend to be relatively expensive; but for users who need such high-speed capability, the cost is justified. Another class of users of relatively general-purpose ICs may not need such high-speed data communication capability. This segment of the market does not want to pay the cost of high-speed devices, and is instead looking for lower-cost devices that do not have high-speed capability.

In addition to the above two classes of users, there are some users who mostly need relatively low-speed capability, but who also need some limited high-speed capability. For example, such a user may need an IC that can handle a number of relatively low-speed serial data signals, as well as a few high-speed serial data signals. A relatively inexpensive, all-low-speed IC cannot meet this user's need; but an all-high-speed IC (although it can meet the user's need) may be more expensive than the user is willing to pay. To more economically meet the needs of this type of user (and increase the market penetration (sales volume) of a basically low-cost IC design), it would be advantageous to economically and efficiently include some higher-speed data communication capabilities in relatively low-cost ICs that are otherwise primarily designed to support relatively low-speed data communication.

SUMMARY

In accordance with certain possible aspects of the disclosure, an integrated circuit ("IC") includes physical media access or attachment ("PMA") circuitry, which in turn includes two different kinds of transceiver channels for serial data signals. One kind of transceiver channel is adapted for transceiving (transmitting and/or receiving) relatively low-speed serial data signals. The other kind of transceiver channel is adapted for transceiving relatively high-speed serial data signals. A high-speed channel may be alternatively usable as phase-locked loop ("PLL") circuitry for providing a clock signal for use by other high- and/or low-speed channels. A low-speed channel may alternatively be able to get a clock signal from separate low-speed PLL circuitry.

Further features of the disclosure, its nature and various advantages, will be more apparent from the accompanying drawings.

DETAILED DESCRIPTION

Figure 1:
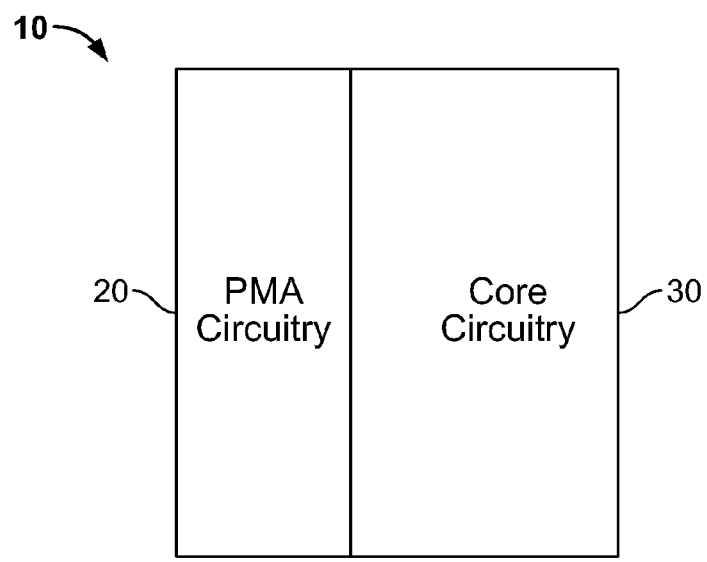
FIG. 1 is a simplified block diagram of an illustrative embodiment of circuitry that can be constructed in accordance with certain possible aspects of this disclosure.

A typical IC 10 that may be constructed in accordance with this disclosure is shown in FIG. 1. IC 10 may be a relatively general-purpose device such as an FPGA, a PLD, a programmable microcontroller, or the like. Any of the terms "programmable integrated circuit," "programmable IC," "configurable integrated circuit," or "configurable IC" may be used as a generic term for all such relatively general-purpose devices. Also, the term "general-purpose" will sometimes be used in lieu of "relatively general-purpose" in order to simplify the wording. But it will be understood that both of these terms have basically the same meaning, i.e., a device that can satisfy any of several different needs within a range of needs that is supported by the device.

Returning to FIG. 1, device 10 is shown as including physical media attachment or access ("PMA") circuitry 20, and core circuitry 30. PMA circuitry 20 may include several channels of transceiver circuitry. Each such transceiver channel may receive a serial data signal from a source external to IC 10. Alternatively or in addition, each such transceiver channel may transmit a serial data signal to a destination external to IC 10.

On the receiver ("RX") side, a transceiver channel in PMA circuitry 20 may (inter alia) perform a clock and data recovery ("CDR") operation on the received serial data signal to recover (1) clock information and (2) data information from that signal. The channel may then apply at least the recovered data information to core circuitry 30. Typically this is done after the channel has converted the recovered data information from serial to parallel form.

On the transmitter ("TX") side, a transceiver channel in PMA circuitry 20 may (inter alia) convert data signals received in parallel from core circuitry 30 to a serial data signal. The channel may then output that serial data signal from device 10.

(A "serial data signal" may be a so-called single-ended signal, or it may be a differential signal comprised of two signal constituents that are the logical complement of one another. In either case, the singular form "serial data signal" will be used to simplify the terminology employed herein.)

Core circuitry 30 is typically circuitry for processing data received from PMA circuitry 20 and/or for applying data to PMA circuitry 20. For example, core circuitry 30 may include digital signal processing ("DSP") circuitry, programmable logic circuitry, microprocessor circuitry, memory circuitry, etc. Core circuitry 30 may be per se conventional. This disclosure relates primarily to PMA circuitry of the general type illustrated by circuitry 20. The following discussion will therefore deal mostly with PMA circuitry, and it will not be necessary to say much more about the other circuitry (e.g., like core circuitry 30) that is included in an IC (e.g., like 10) with the below-described PMA circuitry.

Known low-cost configurable ICs typically focus on supporting transceiver communication protocols having relatively low-speed data rates (e.g., in a range from about 600 megabits per second ("600 Mbps") to about 6 gigabits per second ("6 Gbps")). In the typical known design, the transceiver strip (or high-speed serial interface ("HSSI") strip) (e.g., like PMA circuitry 20 in FIG. 1) uses a single type of PMA design (e.g., for all transceiver channels). This single type of PMA design may use one clock and data recovery ("CDR") architecture, and may therefore be referred to as a "homogeneous" PMA.

It is here thought desirable to improve low-cost configurable ICs by enabling them to support limited high-speed transceiver protocols (e.g., employing data rates greater than 6 Gbps) in addition to the above-mentioned low-speed protocols. For example, such additional high-speed transceiver capability may increase the size of the market for the IC and thereby increase its value as a product to the manufacturer. However, adhering to the conventional homogeneous PMA approach would mean that the receiver ("RX") clock and data recovery ("CDR") circuitry would need to support the highest data rate in every channel, even though that is not expected by the market for low-cost products of this kind. Designing the PMA in this way (i.e., with highest data rate CDR capability in all transceiver channels) would increase the area cost of the transceiver and thus defeat the objective of providing a low-cost device that provides a good balance between features (range of capabilities) and price.

Figure 2:
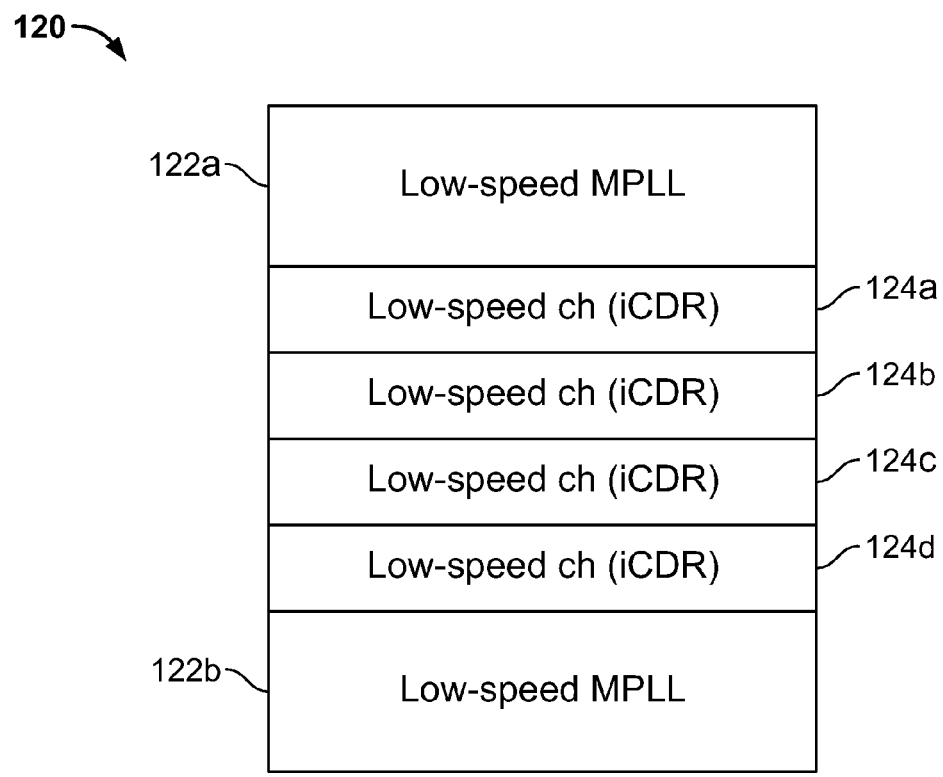
FIG. 2 is a simplified block diagram of a known circuit configuration.
Figure 3:
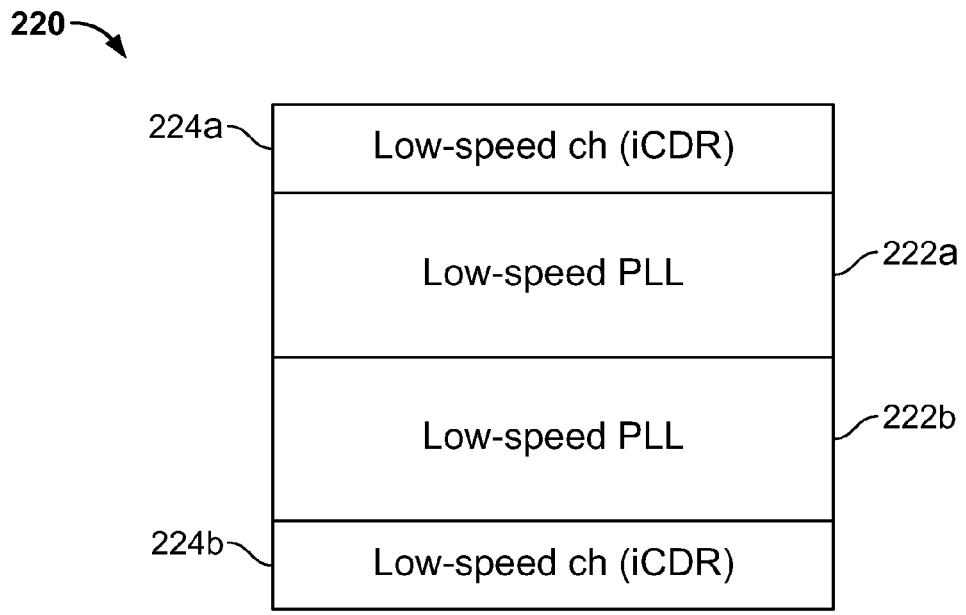
FIG. 3 is a simplified block diagram of another known circuit configuration.
Figure 4:
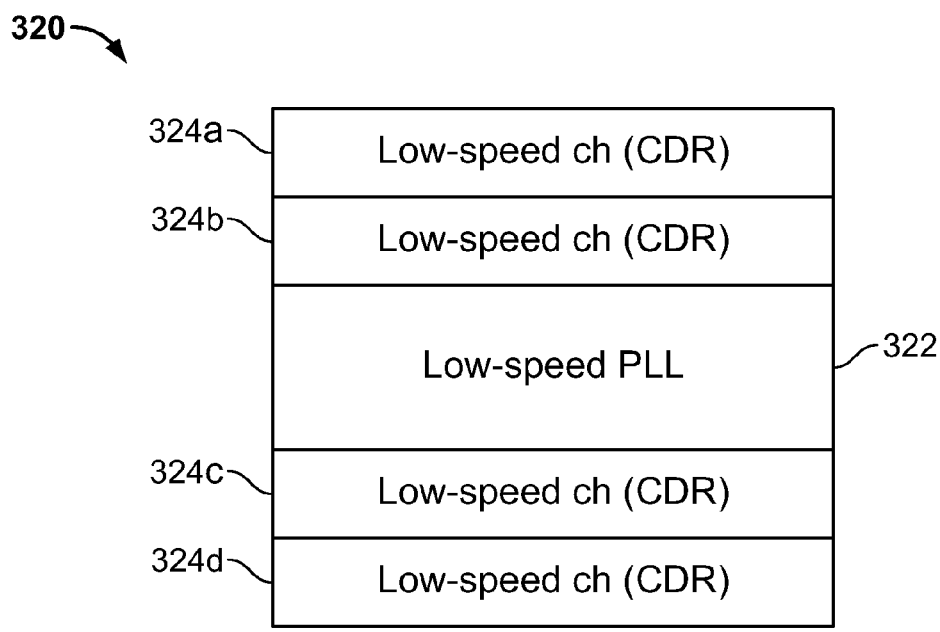
FIG. 4 is a simplified block diagram of still another known circuit configuration.

FIGS. 2, 3, and 4 show several examples of known homogeneous PMA designs in low-cost configurable ICs. Within each of these known designs the PMA channels are all of one type of CDR circuitry and support only a single data rate. For example, the known homogeneous PMA arrangement 120 shown in FIG. 2 includes several low-speed transceiver channels 124a-d and some instances 122a and 122b of low-speed, multi-purpose, phase-locked loop ("PLL") circuitry. The CDR circuitry in each of these channels is interpolator-based CDR circuitry (referred to herein as "iCDR" circuitry). Low-cost configurable ICs benefit from resource sharing such as the use of multi-purpose PLLs ("MPLLs") 122. This can help to reduce the area cost of the PLL. An MPLL can be used to provide a transmit ("TX") clock for the transceiver channels 124, or to support (e.g., provide a clock signal for) general-purpose applications (e.g., in the core circuitry 30 associated with PMA 120). For example, the output of the MPLL 122 can be divided down to support general-purpose applications such as memory interface, low-voltage differential signalling ("LVDS"), and core 30 clocking.

FIG. 3 shows another known homogeneous PMA arrangement 220. This arrangement again includes low-speed transceiver channels 224a and 224b employing iCDR circuitry. In this arrangement, low-speed PLLs 224a and 224b are not MPLLs, but rather are dedicated to supporting the transceiver channels.

FIG. 4 shows yet another known homogeneous PMA arrangement 320. In this arrangement, low-speed transceiver channels 324a-d are not interpolator-based, but rather can be voltage-controlled oscillator ("VCO") based. Low-speed PLL 322 is again not multi-purpose, but rather is dedicated to supporting the transceiver channels.

In order to give a basically low-cost general-purpose IC some high-speed serial data signalling or communication capability, this disclosure introduces what may be referred to as a heterogeneous PMA into the IC. The heterogeneous PMA architecture offers a competitive cost structure compared to the homogeneous PMA. The heterogeneous PMA includes combinations of (1) low-speed, interpolator-based CDR channels, and (2) high-speed, analog-based (e.g., VCO-based) CDR channels with clock-multiplying units ("CMUs"). (The acronym "aCDR" may be used to refer to analog-based CDR.) The high-speed aCDR-based channels with CMU can work double-duty as either a high/low-speed clock source for the transceiver, or as a high-speed PMA channel.

Interpolator-based CDRs ("iCDRs") are normally used in low-end transceivers because they consume less area (i.e., take up less space) on an IC. However, iCDRs are harder to re-architect (re-design) to run at higher speed. On the other hand, aCDRs are typically used in high-end receivers because they can support higher data rates. However, the area usage of aCDRs is greater than the area usage of iCDRs. It is easier to design an aCDR to run at higher frequency because its maximum speed is determined by the speed of its voltage-controlled oscillator ("VCO"). The speed of VCOs tends to increase as the scale (size) used for fabricating ICs becomes smaller.

A consideration that may facilitate providing heterogeneous PMA circuitry in accordance with this disclosure is that the size of a PLL circuit is similar to the size of an aCDR-based channel. By adding a TX driver and an RX driver, a PLL can be converted to an aCDR-based channel with a CMU. Because a high-speed PLL used to support a transceiver cannot easily be used to generate the clock for general-purpose applications, it is more cost-effective to convert it to a high-speed channel. This effectively reduces the area cost of the PLL.

Figure 5:
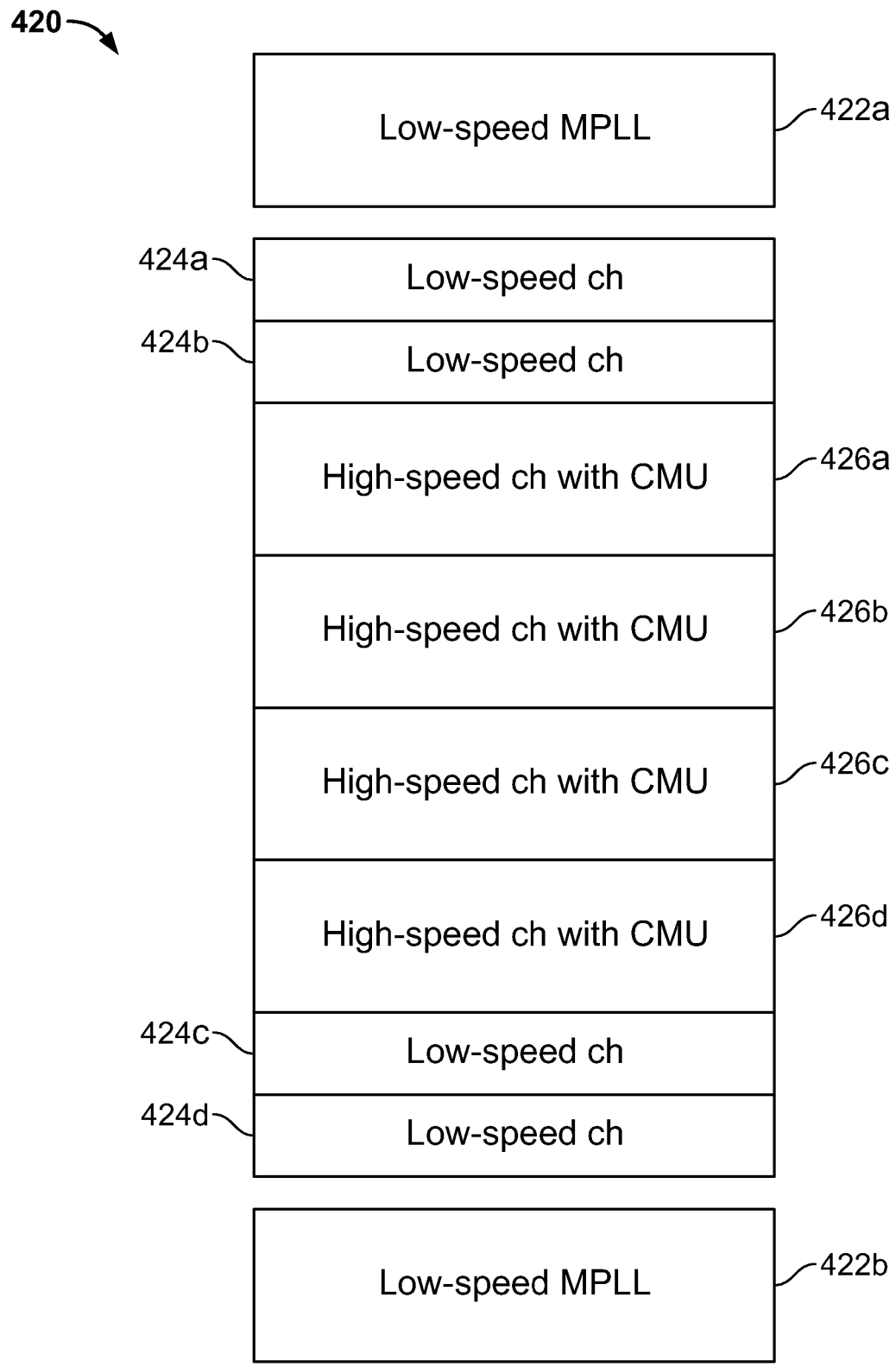
FIG. 5 is a simplified block diagram of an illustrative embodiment of circuitry in accordance with certain possible aspects of this disclosure.

An illustrative arrangement for the components of heterogeneous PMA circuitry 420 in accordance with this disclosure is shown in FIG. 5. The components of circuitry 420 include low-speed MPLL channels 422a and 422b, low-speed transceiver channels 424a-d, and high-speed transceiver channels with CMUs 426a-d. The high-speed and low-speed channels are preferably grouped separately to reduce channel-to-channel skew (i.e., different amounts of signal delay in different channels that may need to be used together). For example, all of channels 426a-d may be placed adjacent to one another for such skew reduction purposes. Similarly, channels 424a and 424b are placed adjacent to one another, and channels 424c and 424d are placed adjacent to one another. The low-speed PLL(s) 422a/b for general-purpose applications (e.g., for providing clock signals for use in core circuitry like 30 in FIG. 1) can alternatively or additionally be used to clock the low-speed channels in the HSSI strip 420, if needed.

It will be understood that FIG. 5 shows what may be only one representative instance of circuitry 420 on an IC like IC 10 in FIG. 1; and that the PMA circuitry 20 of such a FIG. 1 IC 10 may include several instances (i.e., identical or substantially identical repetitions) of circuitry like 420 in accordance with this disclosure.

A major advantage of the heterogeneous PMA approach in accordance with this disclosure is that it allows flexibility in adjusting the relative numbers of low-speed channels and high-speed channels to fit the product requirements of various classes of users, while at the same time achieving the lowest area cost. For example, one product in a family of general-purpose ICs can be provided (manufactured) with a relatively large number of low-speed transceiver channels like 424, and with no or only a very small number of high-speed transceiver channels like 426. Another product in that family can be provided (manufactured) with a slightly smaller number of low-speed channels 424 and a slightly larger number of high-speed channels 426. Still another product in the family can be provided (manufactured) with a further reduced number of low-speed channels 424 and a further increased number of high-speed channels 426. The number of high-speed channels 426 (e.g., relative to the number of low-speed channels 424) can be determined by the number of PLLs needed for supporting various communication protocols. This can be determined in turn by looking at how various users are using (or may want to use) general-purpose IC products.

Figure 6:
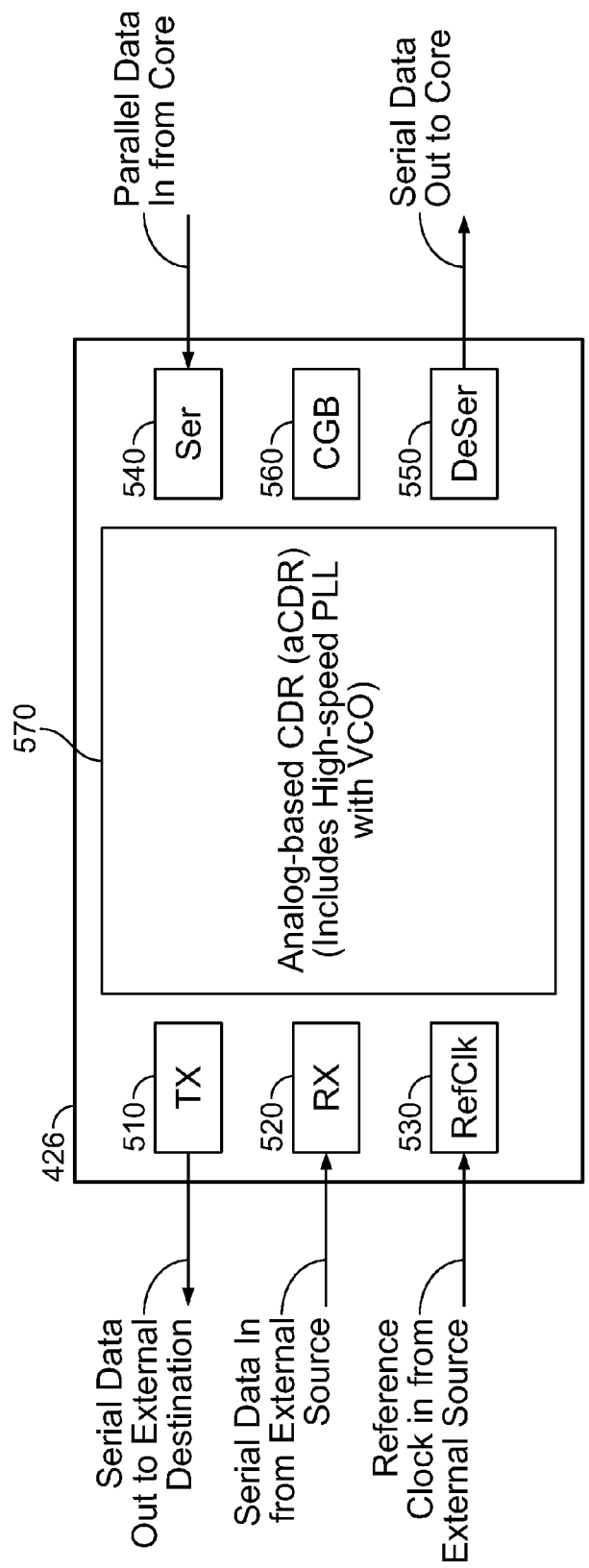
FIG. 6 is a simplified block diagram of an illustrative embodiment of a representative one of certain elements in FIG. 5.

FIG. 6 shows an illustrative embodiment of the internal circuitry of a representative high-speed PMA channel 426 with CMU from FIG. 5. This circuitry includes transmit (or transmitter) buffer circuitry ("TX") 510; receive (or receiver) buffer circuitry ("RX") 520; reference input clock buffer circuitry ("RefClk") 530; serializer circuitry ("SER") 540; deserializer circuitry ("DESER") 550; clock generation buffer circuitry ("CGB") 560; and analog-based (e.g., voltage-controlled oscillator or VCO-based) clock and data recovery circuitry ("aCDR") 570. The transmit buffer or TX 510 may function as the differential amplifying stage with pre-emphasis to transmit a serial data signal (comprising two complementary (or differential) signal constituents) out from channel 426. The receive buffer or RX 520 may receive a differential serial data signal from another system component (external to IC 10) and may be equipped with equalizers for gain compensation. The RX buffer 520 may also function as an input reference clock buffer if the channel is used as a CMU. The serializer or SER 540 may be used to convert a plurality of parallel data signals from core 30 to one serial data signal so that the data can be transmitted out from the channel via TX 510. The deserializer or DESER 550 may do the opposite by converting a recovered serial data signal from aCDR 570 to a plurality of parallel data signals for application to core 30. The clock generation buffer or CGB 560 may be used to transmit the clock from aCDR 570 when the aCDR functions as a clock generator to other channels in the HSSI strip 20/420. The CGB 560 may also be used to select the clock source for the serializer (540) at the transmit path where the data is transmitted out from the channel through the TX (510). (Although FIG. 6 shows the reference clock coming from an "external source," the reference clock source could alternatively be internal to IC 10.)

Figure 7:
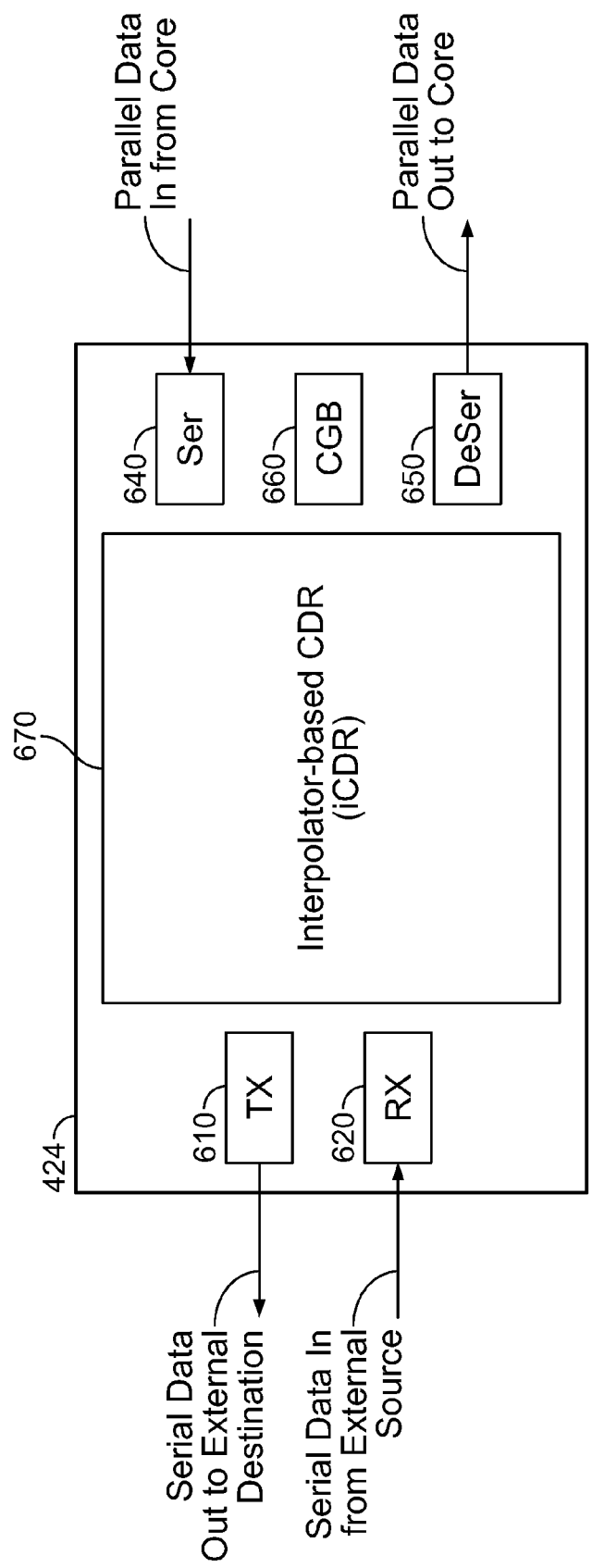
FIG. 7 is a simplified block diagram of an illustrative embodiment of a representative one of certain other elements in FIG. 5.

FIG. 7 shows an illustrative embodiment of the internal circuitry of a representative low-speed PMA channel 424 from FIG. 5. This circuitry is conceptually similar to the FIG. 6 circuitry on the basis of the following correlation between functionally similar elements in FIGS. 6 and 7: 510 and 610; 520 and 620; 540 and 640; 550 and 650; 560 and 660; and 570 and 670. The circuitry of these functionally similar elements may be implemented somewhat differently; but their overall functions are similar. Because those functions are described above for FIG. 6, it will not be necessary to repeat that description again in connection with FIG. 7. It is specifically noted, however, that whereas circuitry 570 is analog-based CDR (or "aCDR") circuitry, circuitry 670 is interpolator-based CDR (or "iCDR") circuitry.

Figure 8:
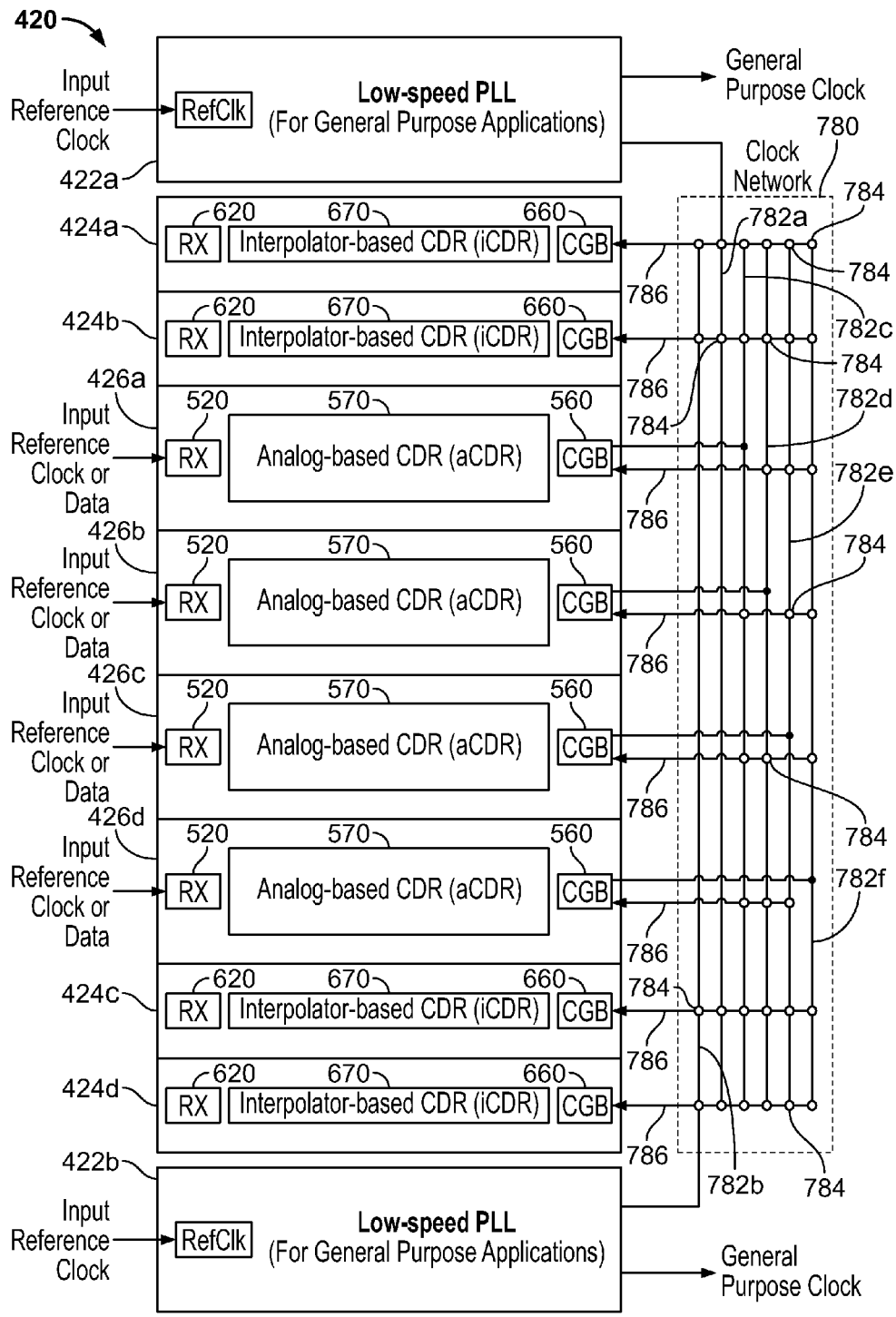
FIG. 8 is an illustrative embodiment of what is shown in FIG. 5 with more circuitry shown in accordance with certain possible aspects of the disclosure.

FIG. 8 shows an illustrative embodiment of a clock signal network 780 for a heterogeneous PMA 420 such as is shown in FIG. 5. Clock network 780 is typically part of the heterogeneous PMA 420 (and therefore part of circuitry 20 in FIG. 1 when circuitry 20 has a heterogeneous PMA construction in accordance with this disclosure). For simplicity (and to avoid over-crowding FIG. 8), only the RX, CDR, and CGB circuit components of each transceiver channel are shown in FIG. 8. The sources of clock signals for clock network 780 are (1) low-speed PLLs 422a and 422b, and (2) high-speed PMA channels with CMUs 426a-d. Thus, for example, each low-speed PLL 422 can apply a low-speed clock signal to a respective one of inter-channel clock signal conductors 782a-b in clock network 780. Similarly, each high-speed channel with CMU 426a-d can apply a clock signal to a respective one of inter-channel clock signal conductors 782c-f in clock network 780. All of conductors 782 extend past (adjacent to) all of the low- and high-speed channels in heterogeneous PMA circuitry 420.

Each low-speed channel 424 can be clocked by (i.e., can get a clock signal from) any of conductors 782. Thus, for example, the clock signal input conductor 786 to each of low-speed channels 424 has a programmably selectable (activatable) connection 784 to each of conductors 782. (Each of the small, open circles at the intersection of two conductors 782 and 786 in FIG. 8 indicates such a programmable interconnection 784 between those two conductors. Each such interconnection (connection) can be "made" or "not made," depending on the logical state (e.g., logic 1 or logic 0) of a control signal (not shown in FIG. 8) that is applied to that interconnection element 784. Only some representative ones of the small, open circles in FIG. 8 are shown with the reference number 784 (to avoid over-crowding the drawing). But it will be understood that each such small, open circle in FIG. 8 indicates the presence of a programmable interconnection between the conductors that intersect at the location of that circle. The signals for controlling these interconnections 784 can come from other circuit elements that are part of IC 10. For example, these other circuit elements are typically programmable or configurable elements such as fuses, anti-fuses, metal-optional links, memory elements such as so-called configuration random-access memory ("CRAM") elements, or the like. One possibility is for these elements to be programmed or configured during an initialization (or re-initialization) phase of operation of IC 10 (which typically occurs relatively infrequently, and which precedes so-called normal or user-mode operation of the IC (such user-mode being operation of the IC to input and output serial data signals as is discussed elsewhere in this specification).)

On the other hand, each high-speed channel 426 can be clocked by (i.e., can get a clock signal from) only some of conductors 782. In particular, each high-speed channel 426 can get a clock signal via clock network 780 only from any other one of the high-speed channels 426. As just one exemplary illustration of this, the CGB 560 in channel 426*a* can receive a clock signal 786 from any one of conductors 782*d-f* by programmable or selectable closure (closing) of the programmable connection 784 between that conductor 786 and the desired one of conductors 782*d-f*. The signals on conductors 782*d-f* come from the CGBs 560 in channels 426*b-d*, respectively (as was mentioned earlier).

From the above discussion and FIG. 8 it will be seen that each of high-speed channels 426 can be used as either (1) a PLL for providing a clock signal for use by any one or more other high- and/or low-speed channel 426/424, or (2) a CDR channel for recovering data and clock information from an applied high-speed serial data input signal and employing in that CDR operation the reference clock signal that is applied to that channel. For simplicity, the preceding sentence mentions only RX operations of high-speed channels 426. However, it will be understood that each high-speed channel 426 can alternatively or additionally be used for transmitting (outputting from IC 10) a high-speed serial data signal and employing in that transmitting operation a clock signal from clock network 780.

Also from the above discussion and FIG. 8 it will be seen that each of low-speed channels 424 can be used as a CDR channel for recovering data and clock information from an applied low-speed serial data input signal. Alternatively or in addition, each of low-speed channels 424 can be used for transmitting (outputting from IC 10) a low-speed serial data signal, and employing in that transmitting operation a clock signal from clock network 780.

Note that FIG. 8 shows general-purpose clocks (e.g., for use in core circuitry 30) coming only from low-speed PLLs 422 (not from high-speed channels 426).

Figure 9:
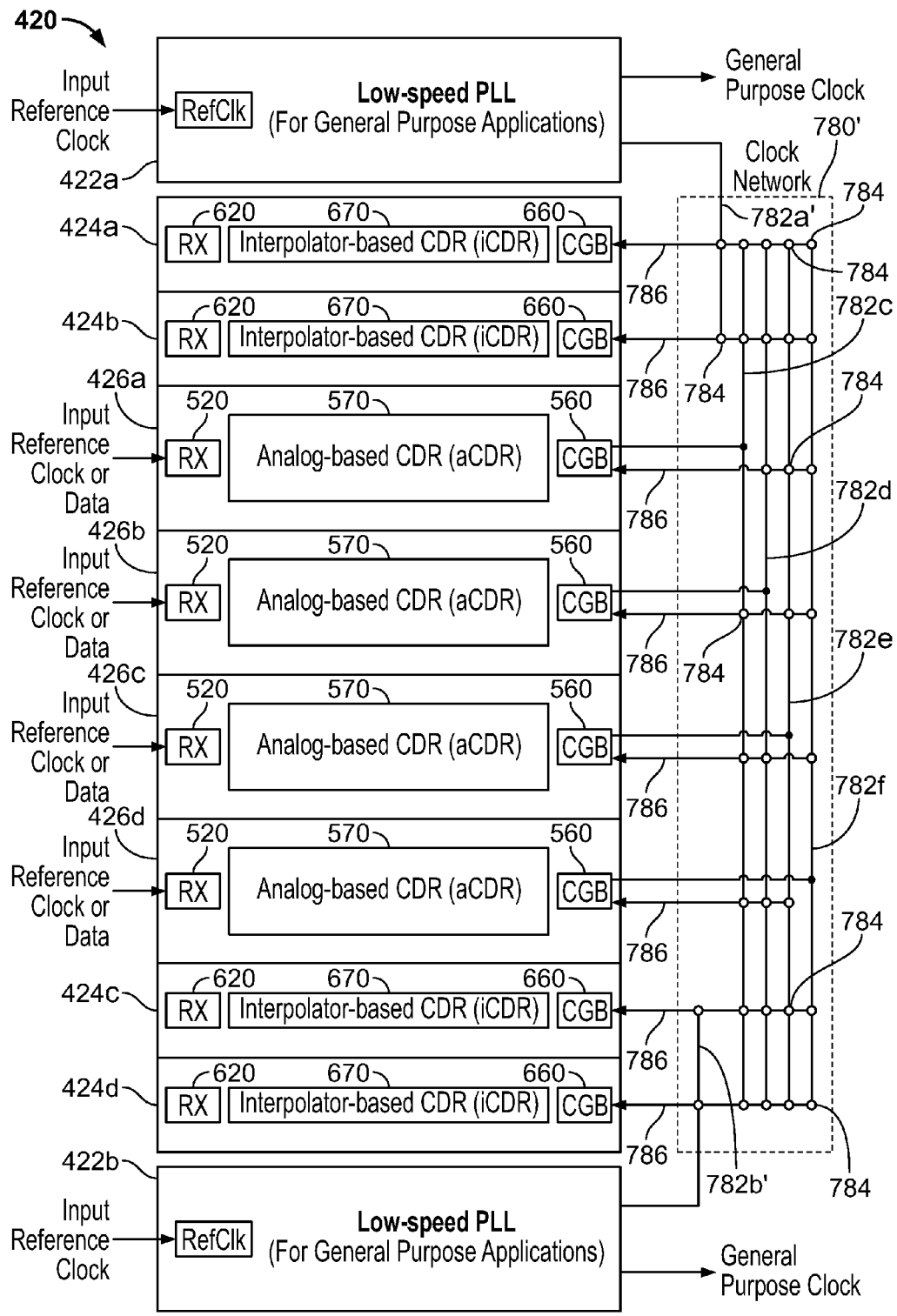
FIG. 9 shows an illustrative alternative embodiment of what is shown in FIG. 8 in accordance with certain possible aspects of the disclosure.

FIG. 9 shows an illustrative alternative embodiment of a clock signal network 780' for a heterogeneous PMA 420 such as is shown in FIG. 5. Clock network 780' is generally similar to clock network 780 (FIG. 8), except for the differences noted below. In clock network 780' upper PLL 422*a* can drive (provide a clock signal for) only the upper half low-speed channels 424*a* and 424*b*, and lower PLL 422*b* can drive (provide a clock signal for) only lower half low-speed channels 424*c* and 424*d*. Thus in FIG. 9 inter-channel conductor 782*a'* (for the clock signal from PLL 422*a*) extends past (adjacent to) only low-speed channels 424*a* and 424*b*. Similarly, inter-channel conductor 782*b'* (for the clock signal from PLL 422*b*) extends past (adjacent to) only low-speed channels 424*c* and 424*d*. This implementation may be preferred for cases in which jitter at the clock network 780/780' is causing transceiver channels to fail a jitter specification. By reducing the number of clock signals at the clock network 780', it can be possible to reduce the jitter caused by the coupling of the clock signals.

The above-described heterogeneous PMA approach has a significant required-area advantage over the homogeneous approach. The heterogeneous approach can also facilitate reuse of existing designs (e.g., known designs for iCDR circuitry and separately known designs for aCDR circuitry). Thus, for example, the heterogeneous approach avoids the risk of attempting to redesign iCDR circuitry to run at higher speeds. The heterogeneous approach allows the number of high-speed channels versus low-speed channels to be adjusted to fit any of a range of different product requirements and to achieve low area cost.

Figure 10:
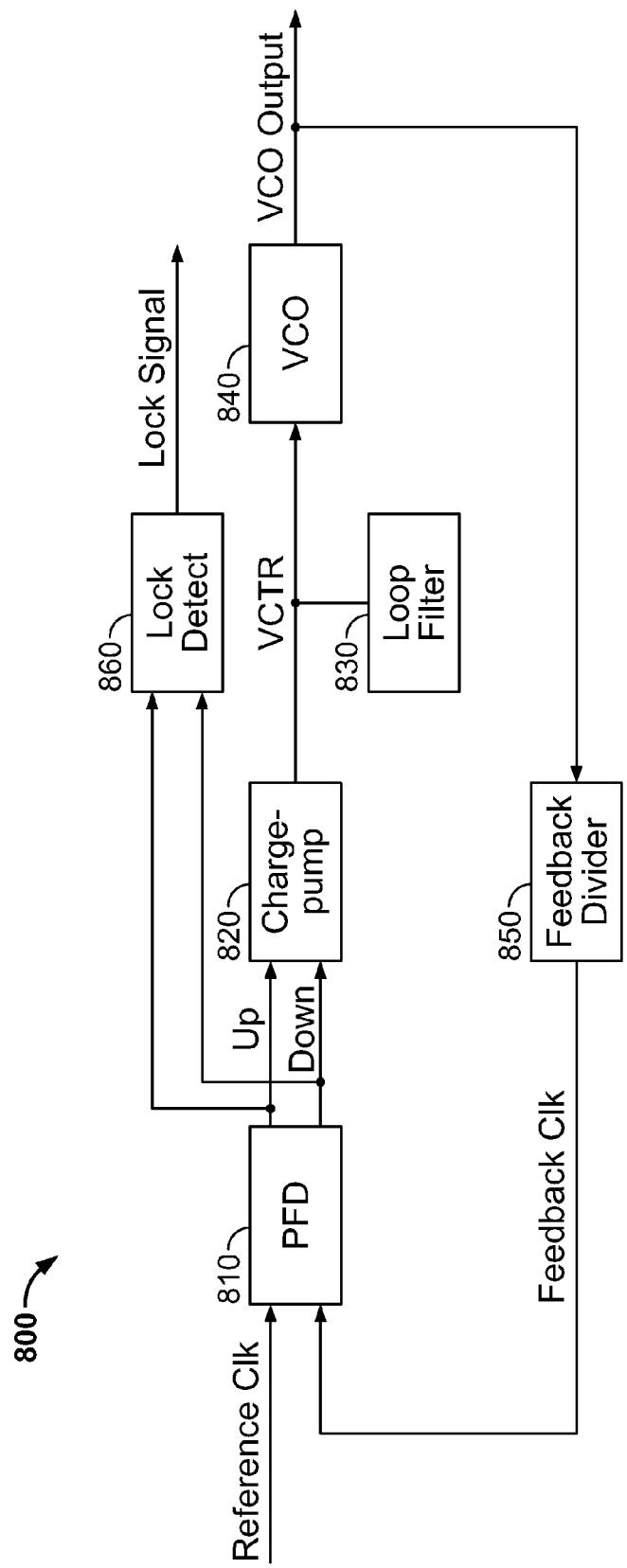
FIG. 10 is a simplified block diagram of an illustrative embodiment of circuitry that can be used for various components elsewhere in this disclosure.

In the interest of completeness, FIG. 10 shows an example of typical PLL circuitry 800 that can be used for PLL circuitry elsewhere in this disclosure. PLL 800 is an electronic circuit with a voltage- or current-driven oscillator 840 that is constantly adjusted to match in phase (and thus lock on) the frequency of a reference clock signal. In addition to stabilizing a particular communication channel (keeping it set to a particular frequency), a PLL can be used to generate a signal, modulate or demodulate a signal, reconstitute a signal with less noise, or multiply or divide a frequency. PLLs are commonly used for digital data transmission.

As shown in FIG. 10, a PLL 800 may include a voltage-controlled oscillator ("VCO") 840, a phase frequency detector ("PFD") 810, a charge pump ("CP") 820, lock detect ("LD") circuitry 860, loop filter ("LF") circuitry 830, and feedback frequency divider circuitry 850. VCO 840 is tuned to a frequency close to the desired receiving or transmitting frequency by means of a feedback scheme. If the VCO frequency (after division by divider 850) departs from the input reference clock frequency, PFD 810 produces an error pulse that is applied to CP 820, thereby tending to bring the VCO back to (a multiple of) the reference frequency. (The "multiple" mentioned in the preceding sentence is the reciprocal of the divider 850 frequency division factor.) For example, if the feedback frequency is lower than the reference clock frequency, PFD 810 sends an UP pulse to CP 820, which delivers an exact amount of charge to the voltage control ("VCTR") node and LF 830 to speed up VCO 840. On the other hand, if the feedback frequency is faster than the reference frequency, PFD 810 sends a DOWN pulse to CP 820, which discharges a precise charge from VCTR and LF 830 in order to slow down VCO 840. VCTR controls the speed of VCO 840. When PLL 800 is in lock, the VCTR voltage should be stable at a certain value. LD 860 monitors error (UP and DOWN) pulses to determine whether the PLL is in lock with the reference clock. The error pulses should be very small or infrequent when the PLL is in lock.

Although any PLL used throughout this disclosure may employ the general PLL architecture shown in FIG. 10, it will be appreciated that the circuitry of some PLLs herein may be adapted for operating in different speed (frequency) ranges than other PLLs herein. For example, some PLLs herein may be adapted for operating in a relatively low frequency range, while other PLLs herein may be adapted for operating in a relatively high frequency range. It will also be understood that the PLL architecture shown in FIG. 10 is only illustrative, and that other PLLs may be used for some or all of the PLLs herein if desired.

Figure 11:
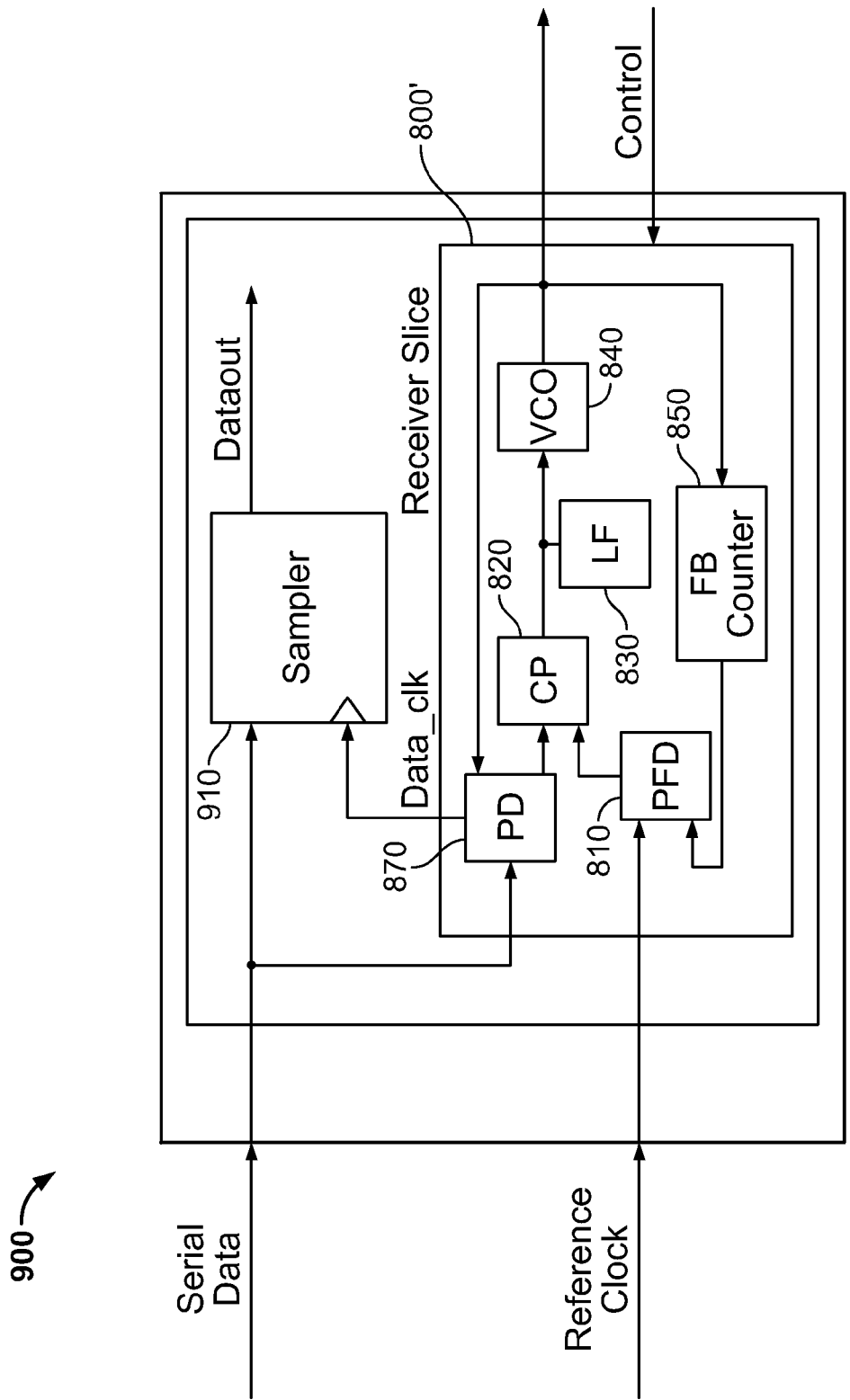
FIG. 11 is a simplified block diagram of an illustrative embodiment of other circuitry that can be used for various components elsewhere in this disclosure.

An illustrative embodiment of aCDR circuitry 900 (e.g., like 570 in FIG. 6) is shown in FIG. 11. Circuitry 900 includes PLL circuitry 800', which can be the same as circuitry 800 with the addition of a second feedback loop including phase detector ("PD") 870. The feedback loop that was described earlier in connection with FIG. 10 may be referred to as the reference loop. The loop including PD 870 maybe referred to as the data loop. In addition to PLL circuitry 800', aCDR circuitry 900 may include data signal sampler 910.

As shown in FIG. 11, aCDR 900 receives both the serial data signal and the reference clock signal (described earlier in connection with FIG. 10). As was briefly mentioned in the preceding paragraph, PLL version 800' includes two fully integrated loops. These are (1) the lock-to-clock loop (including PFD 810) and (2) the lock-to-data loop (including PD 870). Both loops share a common CP 820, loop filter 830, and VCO 840. The PFD loop is equivalent to a normal PLL structure 800. It is used to train the PLL to a desired frequency by using the correct feedback counter (frequency divider) 850 value. The PD loop is used to align the PLL output clock frequency with the incoming serial data signal.

The clock recovery control ("CRC" or "control") always starts up circuitry 800' using the PFD loop (or PFD mode). Once circuitry 800' reaches the desired output frequency (as indicated by assertion of the lock signal as shown in FIG. 10), the control signal automatically switches circuitry 800' from the PFD loop to the PD loop so that circuitry 800' can thereafter track the incoming serial data signal and generate the recovered clock ("data_clk") promptly (because the correct basic frequency has already been determined while circuitry 800' was in lock-to-reference mode). Within circuitry 900 there may be a parts-per-million ("PPM") detection circuit (not shown separately) that constantly checks the parts-per-million difference between the frequency of the recovered clock and the reference clock. If CDR circuitry 900 drifts too far from the desired frequency (e.g., as in the case of excessive spread spectrum), the PPM detection circuit switches the CDR from the PD loop back to the PFD loop so that the CDR output frequency is maintained.

Note that if circuitry 900 is an instance of circuitry 570 in a channel that is being used as PLL circuitry (rather than CDR circuitry), then that instance of circuitry 900 may receive only a reference clock signal, and only the PFD loop in that circuitry 800' may be used.

Figure 12:
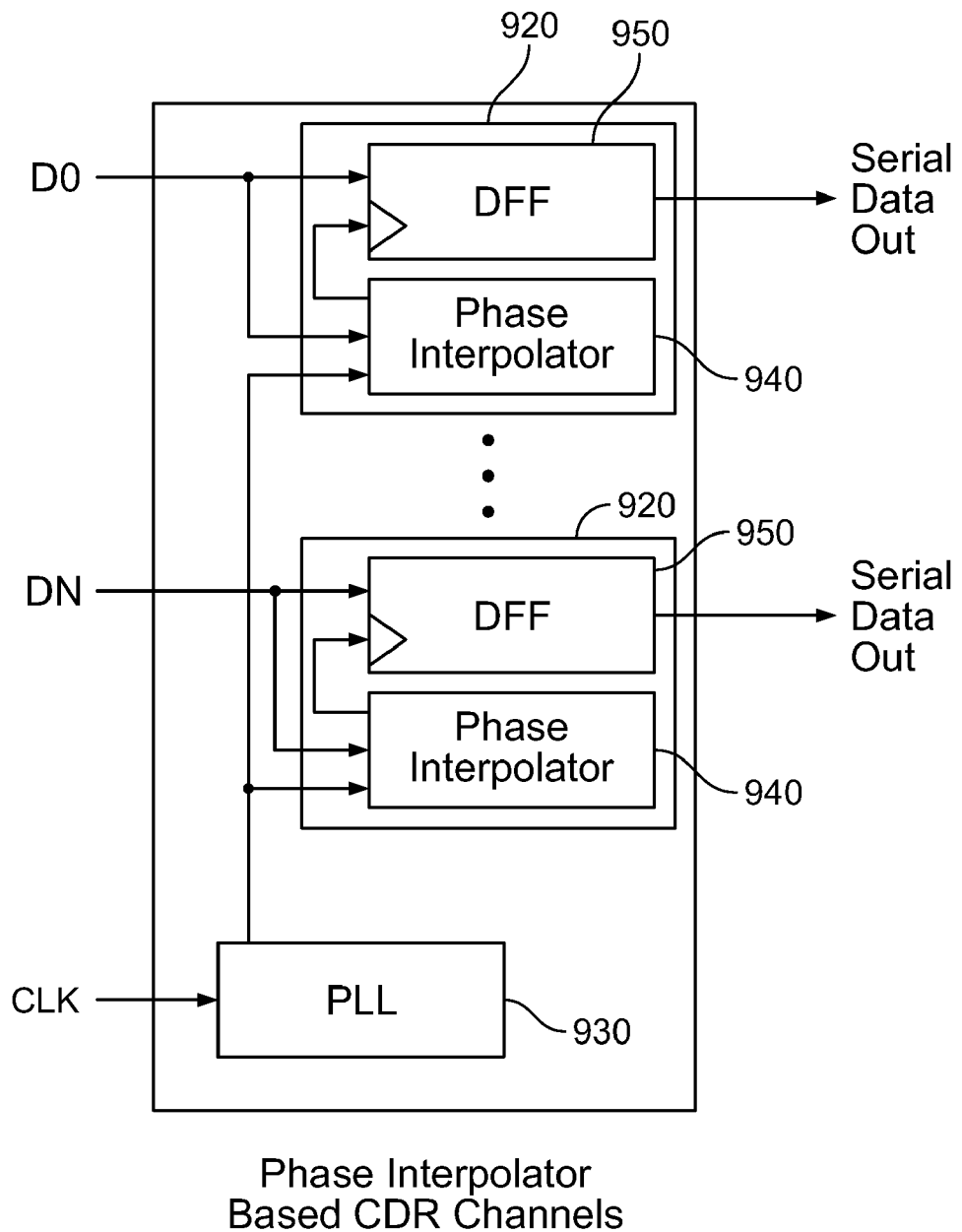
FIG. 12 is a simplified block diagram of an illustrative embodiment of still other circuitry that can be used for various components elsewhere in this disclosure.

An illustrative embodiment of iCDR circuitry 920 is shown in several instances in FIG. 12. Circuitry like 920 can be used for any instance of iCDR circuitry throughout this disclosure. An iCDR-based receiver normally uses a PLL 930 to support its receiving operation. PLL 930 outputs a high-speed clock to the phase interpolator 940 in each iCDR channel 920 that is supported by that PLL. Each phase interpolator 940 generates (by interpolation) different phases of the PLL clock signal to determine a clock signal phase that is best for clocking the associated flip-flop ("DFF") 950 to sample and latch an incoming serial data signal (e.g., D0, D1, ..., or DN). A phase interpolator 940 may accomplish this by using a phase detector ("PD") similar to the PD 870 in an aCDR as described above. Depending on the desired implementation, each iCDR channel may have its own PLL, or (as shown in FIG. 12) one PLL 930 may be used to support multiple channels (in which case each channel contains only the iCDR circuitry 920 for data reception (and not mentioning here other channel components that are shown and described elsewhere in this disclosure)).

Figure 13:
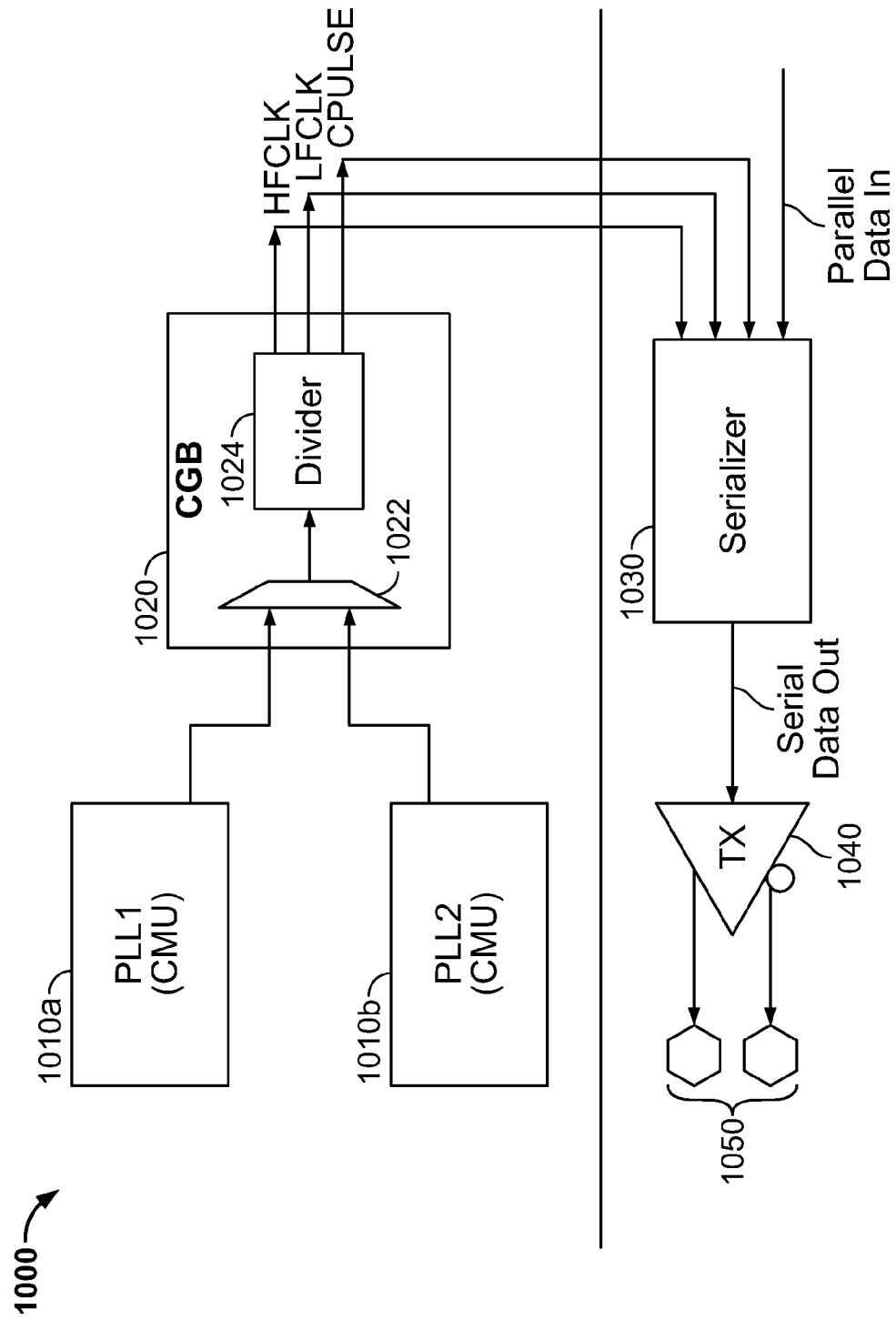
FIG. 13 is a simplified schematic block diagram of an illustrative embodiment of yet other circuitry that can be used for various components elsewhere in this disclosure.

Portions of illustrative clock generation block or buffer ("CGB") circuitry 1000 (and some related circuitry) are shown in FIG. 13. What is shown in FIG. 13 can be typical for any instance of CGB circuitry shown throughout this disclosure. The elements 1010a and 1010b are typical of the sources that can provide clock signals for (1) selection by CGB circuitry 1020, (2) processing by that CGB circuitry, and (3) output by that CGB circuitry for use by TX circuitry 1030/1040/1050 associated with that CGB circuitry. For example, each of elements 1010 can be a respective instance of high-speed channel with CMU circuitry 426 that is being used as a PLL/CMU, rather than for RX CDR. Multiplexer ("mux") 1022 can be an implementation of the controllable interconnections 784 that can supply a selected clock signal from clock network 780 to this particular CGB circuitry. (In other words, mux 1022 is controllable in the manner generally described above for elements 784 to select one of its selectable inputs (from elements 1010) to be the output that it applies to frequency divider circuitry 1024). Divider circuitry 1024 uses the clock signal that is applied to it to produce a high-speed clock ("HFCLK"), a low-speed clock ("LFCLK"), and a clock synchronization signal ("CPULSE"), all of which are applied to the serializer 1030 TX portion of the channel associated with the CGB. For example, LFCLK may be used to clock parallel data into serializer 1030, and HFCLK may be used to clock serial data out of serializer 1030. Element 1040 is TX output driver circuitry, and elements 1050 are the (complementary) output signal pads associated with driver 1050.

The term clock multiplier unit ("CMU") is generally used herein to refer to a transmit PLL ("TXPLL"), i.e., a PLL that is being used to supply a clock signal for clocking the TX circuitry of one or more channels (e.g., as in FIG. 13). A function of a CMU may be to generate a high-speed clock signal based on a user's reference clock and send it to the CGB(s) (e.g., via clock network 780) in order to enable the CGB(s) to produce the clocks (e.g., HFCLK and LFCLK) that are used for transmitting output data.

To some extent recapitulating (and in some respects extending) the foregoing, certain aspects of this disclosure relate to physical media attachment ("PMA") circuitry (e.g., 20, 420) on an integrated circuit ("IC") (e.g., 10). The PMA circuitry may include a first plurality of transceiver channels (e.g., low-speed channels 424), each of which is adapted for transceiving (transmitting and/or receiving) a serial data signal (e.g., "data") having a first relatively low serial data bit rate (e.g., any serial data bit rate in a relatively low serial data bit rate range such as from about 600 Mbps to about 6 Gbps). The PMA circuitry may further include a second plurality of transceiver channels (e.g., high-speed channels 426), each of which is adapted for (1) transceiving a serial data signal (e.g., "data") that can have a serial data bit rate greater than the low-speed channels are adapted to transceive (e.g., any serial data bit rate in a relatively high serial data bit rate range such as from about 6 Gbps to about 12.5 Gbps), or (2) performing a phase-locked loop ("PLL") operation on a received reference clock signal (e.g., "input reference clock") to produce an output clock signal (e.g., output of CGB 560 to clock network 780 or 780'). The PMA circuitry may still further include PLL circuitry (e.g., 422) for producing a further output clock signal (e.g., output from 422 to 780 or 780') from a further received reference clock signal (e.g., "input reference clock"). The "input reference clock" signals may come from one or more sources external to IC 10. The PMA circuitry may yet further include circuitry for selectively applying the output clock signal produced by one of the high-speed channels to another of the high-speed channels (e.g., one of conductors 782c-f, one of conductors 786 to a channel 426, and the programmably controllable interconnection 784 between those two conductors). The PMA circuitry may still further include circuitry for selectively applying the further output clock signal to one of the low-speed channels (e.g., one of conductors 782a-b, one of conductors 786 to a channel 424, and the programmably controllable connection 784 between those two conductors).

In circuitry as recapitulated above, each of the low-speed channels may include clock and data recovery ("CDR") circuitry (e.g., 670). Such CDR circuitry may comprise interpolator-based CDR (e.g., "iCDR") circuitry.

In circuitry as recapitulated above, each of the high-speed channels may include CDR circuitry (e.g., 570). Such CDR circuitry may comprise analog-based CDR ("aCDR") circuitry. Such aCDR circuitry may comprise voltage-controlled-oscillator-based ("VCO-based") CDR circuitry.

In circuitry as recapitulated above, the IC may additionally include core circuitry (e.g., 30). In such a case, the PLL circuitry may be adapted for producing a clock signal (e.g., "general purpose clock"), based on the further received reference clock signal, for use by the core circuitry.

Circuitry as is here being recapitulated may further include circuitry for selectively applying the output clock signal to one of the low-speed channels (e.g., one of conductors 782c-f, one of conductors 786 to a channel 424, and the programmable interconnection 784 between those two conductors).

Circuitry as is here being recapitulated may further include circuitry for selectively applying the output clock signal to any of the low-speed channels (e.g., one of conductors 782c-f, conductors 786 to any of channels 424, and programmably controllable interconnections 784 between those conductors 782 and 786).

Circuitry as is here being recapitulated may further include circuitry for selectively applying the further output clock signal to any of the low-speed channels (e.g., one of conductors 782a-b, conductors 786 to any of channels 424, and programmably controllable interconnections 784 between those conductors 782 and 786).

Recapitulating (and possibly extending) certain others possible aspects of the disclosure, PMA circuitry (e.g., 20/420) on an IC (e.g., 10) may include a first plurality of low-speed receiver channels (e.g., 424), each of which is adapted for receiving a serial data signal (e.g., "serial data in from external source") having a serial data bit rate in a first relatively low bit rate range (e.g., 600 Mbps to 6 Gbps). The PMA circuitry may further include a second plurality of high-speed receiver channels (e.g., 426), each of which is adapted for receiving a serial data signal (e.g., "serial data in from external source) having a serial data bit rate in a second relatively high data bit rate range (e.g., 6 Gbps to 12.5 Gbps) that includes at least some bit rates greater than any bit rate in the first range. At least one of the high-speed channels may be additionally adapted for performing a PLL operation on a reference clock signal from a source external to the IC (e.g., "reference clock in from external source") to produce an output clock signal (e.g., output from a CGB 560 to clock network 780 or 780'). The PMA circuitry may further include circuitry for selectively applying the output clock signal to one of the low-speed channels (e.g., one of conductors 782c-f, one of conductors 786 to a channel 424, and the programmably controllable connection 784 between those two conductors). The PMA circuitry may still further include circuitry for selectively applying the output clock signal to one of the high-speed channels that did not produce the output clock signal (e.g., one of conductors 782c-f, one of conductors 786 to a channel 426, and the programmably controllable connection 784 between those two conductors).

In circuitry as recapitulated above, the PMA circuitry may further include PLL circuitry (e.g., 422) for performing a PLL operation on a further reference clock signal (e.g., "reference clock") received from a source external to the IC to produce a further output clock signal (e.g., output of 422 to 780 or 780'). In such a case, the PMA circuitry may further include circuitry for selectively applying the further output clock signal to one of the low-speed channels (e.g., a conductor 782a-b, a conductor 786 to a low-speed channel 424, and a programmably controlled interconnection 784 between those two conductors).

In circuitry as is here being recapitulated, each of the low-speed and high-speed channels may include CDR circuitry (e.g., 570 and 670). In such a case the CDR circuitry in each of the high-speed channels may include VCO-based CDR circuitry.

In circuitry such as is here being recapitulated, the IC may further include core circuitry (e.g., 30), and the PLL circuitry may be adapted for producing a clock signal (e.g., "general purpose clock"), based on the further reference clock signal, for use by the core circuitry.

Recapitulating (and possibly extending) certain still other possible aspects of the disclosure, PMA circuitry (e.g., 20/420) on an IC (e.g., 10) may include a first plurality of relatively low-speed data signal receiver channels (e.g., 424). The PMA circuitry may further include a second plurality of relatively high-speed serial data signal receiver channels (e.g., 426). At least one of the high-speed channels may be additionally adapted for performing a PLL operation on a reference clock signal (e.g., "input reference clock") to produce an output clock signal. The PMA circuitry may further include circuitry for selectively applying the output clock signal to one of the low-speed channels (e.g., one of conductors 782c-f, a conductor 786 to one of channels 424, and the programmably controlled interconnection 784 between those conductors). The PMA circuitry may still further include circuitry for selectively applying the output clock signal to one of the high-speed channels that did not produce the output clock signal (e.g., one of conductors 782c-f, a conductor 786 leading to one of the channels 426 that did not produce the output clock signal, and the programmably controllable interconnection 784 between those conductors).

Circuitry as recapitulated above may further include circuitry for selectively applying the output clock signal to any of the low-speed channels (e.g., one of conductors 782c-f, a conductor 786 leading to any of low-speed channels 424, and the programmably controlled interconnection 784 between those conductors).

Circuitry as recapitulated above may further include circuitry for selectively applying the output clock signal to any of the high-speed channels that did not produce the output clock signal (e.g., one of conductors 782c-f, a conductor 786 leading to any of high-speed channels 426 other than the one that produced the output clock signal, and the programmably controllable interconnection 784 between those conductors).

Circuitry as recapitulated above may further include PLL circuitry (e.g., 422) for performing a PLL operation on a further reference clock signal (e.g., "input reference clock") to produce a further output clock signal (e.g., output from 422 to a conductor 782). The circuitry may still further include circuitry for selectively applying the further output clock signal to one of the low-speed channels (e.g., a conductor 782a-b, a conductor 786 to one of channels 424, and a programmably controllable interconnection 784 between those conductors).

In circuitry as recapitulated above, each of the serial data signals may come from a source external to the IC (e.g., "serial data in from external source").

It will be understood that the foregoing is only illustrative of the principles of this disclosure, and that various modifications can be made by those skilled in the art without departing from the scope and spirit of the disclosure. For example, the various ratios of number of low-speed PLLs to number of low-speed channels that are shown herein are only illustrative, and ratios that are different from (e.g., larger or smaller than) the illustratively depicted ratios can be used instead, if desired. As another example of modifications within the scope of the disclosure, all of the particular serial data bit rates that are mentioned herein are only illustrative, and each bit rate that is mentioned can be higher or lower in other embodiments in accordance with the disclosure. Of course, any bit rate range must extend from a low end to a high end, and at least some bit rates in any "high-speed" bit rate range are preferably higher than the highest bit rate in the "low-speed" bit rate range that is related to that high-speed range.

What is claimed is:

1. Physical media attachment ("PMA") circuitry on an integrated circuit comprising:
   a first plurality of transceiver channels ("low-speed channels"), each of which is adapted for transceiving a serial data signal having a first relatively low serial data bit rate;
   a second plurality of transceiver channels ("high-speed channels"), each of which is adapted for controllable selection between (1) transceiving a serial data signal that can have a serial data bit rate greater than the low-speed channels are adapted to transceive, and (2) performing a phase-locked loop ("PLL") operation on a received reference clock signal to produce an output clock signal;
   PLL circuitry for producing a further output clock signal from a further received reference clock signal;
   circuitry for selectively applying the output clock signal produced by one the high-speed channels to another of the high-speed channels; and
   circuitry connected to at least a subset of the low-speed channels for selectively applying the further output clock signal to one channel of the subset of low-speed channels.

2. The circuitry defined in claim 1 wherein each of the low-speed channels includes clock and data recovery ("CDR") circuitry.

3. The circuitry defined in claim 2 wherein the CDR circuitry in each of the low-speed channels comprises interpolator-based CDR circuitry.

4. The circuitry defined in claim 1 wherein each of the high-speed channels includes clock and data recovery ("CDR") circuitry.

5. The circuitry defined in claim 4 wherein the CDR circuitry in each of the high-speed channels comprises analog-based CDR circuitry.

6. The circuitry defined in claim 4 wherein the CDR circuitry in each of the high-speed channels comprises voltage-controlled-oscillator-based ("VCO-based") CDR circuitry.

7. The circuitry defined in claim 1 wherein the integrated circuit additionally includes core circuitry, and wherein the PLL circuitry is adapted for producing a clock signal, based on the further received reference clock signal, for use by the core circuitry.

8. The circuitry defined in claim 1 further comprising:
   circuitry connected to at least a subset of the low-speed channels for selectively applying the output clock signal to one of the subset of low-speed channels.

9. The circuitry defined in claim 1 further comprising:
   circuitry for selectively applying the output clock signal to any of the high-speed channels that did not produce the output clock signal.

10. The circuitry defined in claim 1 further comprising:
    circuitry connected to all of the low-speed channels for selectively applying the output clock signal to any one or more of the low-speed channels.

11. The circuitry defined in claim 1 wherein:
    the circuitry connected to at least of a subset of the low-speed channels is connected all of the low-speed channels, for selectively applying the further output clock signal to any one or more of the low-speed channels.

12. Physical media attachment ("PMA") circuitry on an integrated circuit ("IC") comprising:
    a first plurality of low-speed receiver channels, each of which is adapted for receiving a serial data signal having a serial data bit rate in a first relatively low bit rate range;
    a second plurality of high-speed receiver channels, each of which is adapted for receiving a serial data signal having a serial data bit rate in a second relatively high bit rate range that includes at least some bit rates greater than any bit rate in the first range; at least one of the high-speed channels being additionally adapted for performing a phase-locked loop ("PLL") operation on a reference clock signal received from a source external to the IC to produce an output clock signal, the at least one of the high-speed channels being further adapted for controllable selection between performing said receiving and performing said phase-locked loop operation;
    circuitry for selectively applying the output clock signal to one of the low-speed channels; and
    circuitry for selectively applying the output clock signal to one of the high-speed channels that did not produce the output clock signal.

13. The circuitry defined in claim 12 further comprising:
    PLL circuitry for performing a PLL operation on a further reference clock signal received from a source external to the IC to produce a further output clock signal; and
    circuitry for selectively applying the further output clock signal to one of the low-speed channels.

14. The circuitry defined in claim 13 wherein the integrated circuit further comprises core circuitry, and wherein the PLL circuitry is adapted for producing a clock signal, based on the further reference clock signal, for use by the core circuitry.

15. The circuitry defined in claim 12 wherein each of the low-speed and high-speed channels includes clock and data recovery ("CDR") circuitry.

16. The circuitry defined in claim 15 wherein the CDR circuitry in each of the high-speed channels comprises voltage-controlled-oscillator-based ("VCO-based") CDR circuitry.

17. Physical media attachment ("PMA") circuitry on an integrated circuit ("IC") comprising:
    a first plurality of relatively low-speed serial data signal receiver channels;
    a second plurality of relatively high-speed serial data signal receiver channels, at least one of which is additionally adapted for performing a phase-locked loop ("PLL") operation on a reference clock signal to produce an output clock signal, the at least one of the high-speed channels being further adapted for controllable selection between performing as a receiver channel and performing said phase-locked loop operation;
    circuitry connected to at least a subset of the low-speed channels for selectively applying the output clock signal to one channel of the subset of low-speed channels; and
    circuitry connecting each respective one of the high-speed channels to at least a subset of all other high-speed channels, for selectively applying the output clock signal to one channel of the subset of high-speed channels that did not produce the output clock signal.

18. The circuitry defined in claim 17 wherein:
    the circuitry connected to at least a subset of the low-speed channels is connected to all of the low-speed channels, for selectively applying the output clock signal to any one or more of the low-speed channels.

19. The circuitry defined in claim 17 wherein:
    the circuitry connecting each respective one of the high-speed channels to at least a subset of all other high-speed channels connects each respective one of the high-speed channels to all of the other high-speed channels, for selectively applying the output clock signal to any one or more of the high-speed channels that did not produce the output clock signal.

20. The circuitry defined in claim 17 further comprising:
PLL circuitry for performing a PLL operation on a further reference clock signal to produce a further output clock signal; and
circuitry for selectively applying the further output clock signal to one of the low-speed channels.

21. The circuitry defined in claim 17 wherein each of the serial data signals comes from a source external to the IC.

* * * * *